(12) United States Patent
Shibayama et al.

(10) Patent No.: US 7,686,144 B2
(45) Date of Patent: Mar. 30, 2010

(54) VIBRATION ISOLATION DEVICE, ARITHMETIC APPARATUS, EXPOSURE APPARATUS, AND DEVICE MANUFACTURING METHOD

(75) Inventors: Takashi Shibayama, Utsunomiya (JP); Takehiko Mayama, Utsunomiya (JP); Takao Ukaji, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 3 days.

(21) Appl. No.: 12/060,587

(22) Filed: Apr. 1, 2008

(65) Prior Publication Data
US 2008/0246201 A1 Oct. 9, 2008

(30) Foreign Application Priority Data
Apr. 6, 2007 (JP) ............................. 2007-101045

(51) Int. Cl.
*F16M 13/00* (2006.01)
(52) U.S. Cl. .................. 188/378; 267/136; 248/550
(58) Field of Classification Search ......... 188/378–380; 267/136; 248/550; 355/53–72; 250/491.1–492.2; 700/280
See application file for complete search history.

(56) References Cited

U.S. PATENT DOCUMENTS

| | | | | |
|---|---|---|---|---|
| 4,925,139 A * | 5/1990 | McCord | ................... | 248/176.3 |
| 5,812,958 A | 9/1998 | Mayama | ..................... | 701/111 |
| 6,155,542 A | 12/2000 | Kato et al. | ................... | 267/136 |
| 6,170,622 B1 | 1/2001 | Wakui et al. | ................. | 188/378 |
| 6,322,060 B1 * | 11/2001 | Mayama et al. | ............. | 267/136 |
| 6,473,159 B1 | 10/2002 | Wakui et al. | .................. | 355/53 |
| 6,493,062 B2 * | 12/2002 | Tokuda et al. | ................. | 355/53 |
| 6,730,945 B2 | 5/2004 | Chaki | .......................... | 257/159 |
| 6,881,963 B2 * | 4/2005 | Ito | ........................... | 250/491.1 |
| 7,063,192 B2 * | 6/2006 | Mayama | ..................... | 188/378 |
| 7,072,777 B1 * | 7/2006 | Wakui et al. | .................. | 702/56 |
| 7,275,627 B1 | 10/2007 | Mayama | ..................... | 188/378 |
| 2003/0057346 A1 | 3/2003 | Wakui | | |
| 2007/0035713 A1 | 2/2007 | Shibayama | .................. | 355/72 |

FOREIGN PATENT DOCUMENTS

| | | |
|---|---|---|
| JP | 7-93036 | 4/1995 |
| JP | 9-184536 | 7/1997 |
| JP | 2002-89619 | 3/2002 |
| JP | 2003-66152 | 3/2003 |

OTHER PUBLICATIONS

Masayuki Kikuchi, "Real-time Seismology," University of Tokyo Press, Jan. 17, 2003, p. 6.

* cited by examiner

*Primary Examiner*—Christopher P Schwartz
(74) *Attorney, Agent, or Firm*—Fitzpatrick, Cella, Harper & Scinto

(57) ABSTRACT

A vibration isolation device which dampens vibration of an object. The device includes a vibration isolation unit that can be activated in a plurality of vibration isolation modes, an acquisition unit that acquires estimate information associated with vibration of a floor, in which the acquisition unit receives data associated with an influence degree of seismic vibration and an influence time zone of the seismic vibration from an external device, and a control unit that selects a vibration isolation mode from the plurality of vibration isolation modes, in accordance with the estimate information acquired by the acquisition unit, and activates the vibration isolation unit in the selected vibration isolation mode. The control unit switches between the vibration isolation modes of the vibration isolation unit in accordance with the influence degree and the influence time zone.

9 Claims, 8 Drawing Sheets

VIBRATION ISOLATION DEVICE, ARITHMETIC APPARATUS, EXPOSURE APPARATUS, AND DEVICE MANUFACTURING METHOD

This application claims the benefit of Japanese Patent Application No. 2007-101045, filed Apr. 6, 2007, which is hereby incorporated by reference herein in its entirety.

BACKGROUND OF THE INVENTION

1. Field of the Invention

The present invention relates to a vibration isolation device, an arithmetic apparatus, an exposure apparatus, and a device manufacturing method.

2. Description of the Related Art

Active vibration isolation devices (to be simply referred to as vibration isolation device hereafter) are classified into an absolute vibration damping type and a relative vibration damping type. A vibration isolation device of the former type dampens vibration of a structure with respect to an absolutely still point using, for example, a skyhook damper scheme or a skyhook spring scheme. A vibration isolation device of the latter type dampens vibration of an object vibrating by itself, such as a structure which supports the device, and transmits vibration between two structures, that is, a structure supported by the device and a structure supporting the device.

To improve the vibration isolation performance of a vibration isolation device, it is a common practice to decrease the supporting rigidity of the device itself.

A control system of an active vibration isolation device (see, for example, Japanese Patent Laid-Open Nos. 2002-89619 and 7-93036) often includes a damping control system and a position/orientation control system. In recent years, a vibration isolation device of an absolute vibration damping type often uses an arrangement in which a floor vibration feed-forward control system (see, for example, Japanese Patent Laid-Open No. 9-184536) insulates vibration transmission from a support structure of the device to a support object of the device. Floor vibration feed-forward control is a method of mounting an absolute vibration sensor, such as a speedometer or an accelerometer, in a structure which supports a vibration isolation device, and feed-forwards its detection signal to an actuator of the device via a control unit.

An active vibration isolation device of the above-described absolute vibration damping type controls its support object to be still with respect to a virtual absolute still point. When seismic vibration occurs, a structure which is supporting the vibration isolation device and shaking upon the seismic vibration may come into contact with a structure which is supported by vibration isolation device and is absolutely still. This makes it necessary to stop the apparatus before the seismic vibration is transmitted to it.

An earthquake produces roughly three types of seismic waves: a P-wave, which propagates at a relatively high velocity and is readily dampened; an S-wave, which propagates at a velocity lower than that of the P-wave, is hardly dampened, and has the most significant influence on, for example, buildings, and surface waves (a Rayleigh wave and a Love wave), which have rarely posed problems up to now. At a position spaced apart from the hypocenter to a certain degree, surface waves often have only ultralow frequency components, which humans cannot feel. Since the resonance frequencies of surface waves are often enormously lower than those of various structures in this world, they have generally been thought to have no adverse influence on, for example, buildings. Therefore, it is a common practice to estimate the arrival of only P- and S-waves and to issue a warning against them (see Japanese Patent Laid-Open No. 2003-66152).

Various seismic vibration arrival estimation techniques have already been disclosed. Most of these techniques are associated with a method of empirically, approximately calculating the relationship between the time until seismic vibration arrives and the hypocentral distance. The relationship between P- and S-waves has already been announced to the public. According to "Real-time seismology", University of Tokyo Press, issued Jan. 17, 2003, page 6, written by Masayuki Kikuchi, when an earthquake occurs in an upper portion of the earth's crust, a P-wave propagates at a velocity of 6 [km/s] and an S-wave propagates at a velocity of 3.5 [km/s].

However, a demand has arisen for an active vibration isolation device with a higher vibration isolation performance. To meet this demand, the natural frequency of the vibration isolation device itself is lowered, and its support object is controlled to be absolutely still with higher accuracy. This increases a risk that when seismic vibration occurs, a structure supporting a shaking vibration isolation device would come into contact with a structure, which is supported by the device and is absolutely still, due to the propagation of surface waves with ultralow frequencies, which have been thought to have no adverse influence on various structures up to now. That is, in addition to the P- and S-waves, surface waves with ultralow frequencies, which have been thought to have no adverse influence on various structures, are becoming non-negligible.

Surface waves are hardly dampened and circulate around the earth several times when a large-scale earthquake occurs. For this reason, seismic vibration sometimes continues for thirty minutes or more in each region around the world, including regions such as Great Britain in the United Kingdom, which has never been recorded to be a hypocenter.

As described above, surface waves may arrive even in a region which is sufficiently spaced apart from the hypocenter, and in which P- and S-waves are rarely observed. If a vibration isolation device suffers from an abnormality due to the propagation of such surface waves, which humans cannot feel, a lot of time is taken to investigate the cause of the abnormality. This prolongs the time taken to recover the vibration isolation device.

SUMMARY OF THE INVENTION

The present invention has been made in consideration of the above-described problem. The exemplary embodiment provides a resolution for avoiding any fault that occurs due to a vibration, such as seismic vibration.

According to one aspect of the present invention, a vibration isolation device which dampens vibration of an object comprises a vibration isolation unit, which can be activated in a plurality of vibration isolation modes, an acquisition unit configured to acquire estimate information associated with vibration of a floor, and a control unit configured to select a vibration isolation mode from the plurality of vibration isolation modes, in accordance with the estimate information acquired by the acquisition unit, and to activate the vibration isolation unit in the selected vibration isolation mode.

Further features of the present invention will become apparent from the following description of exemplary embodiments, with reference to the attached drawings.

DESCRIPTION OF THE EMBODIMENTS

Preferred embodiments of the present invention will now be described in detail in accordance with the accompanying drawings.

First Embodiment

Figure 4:
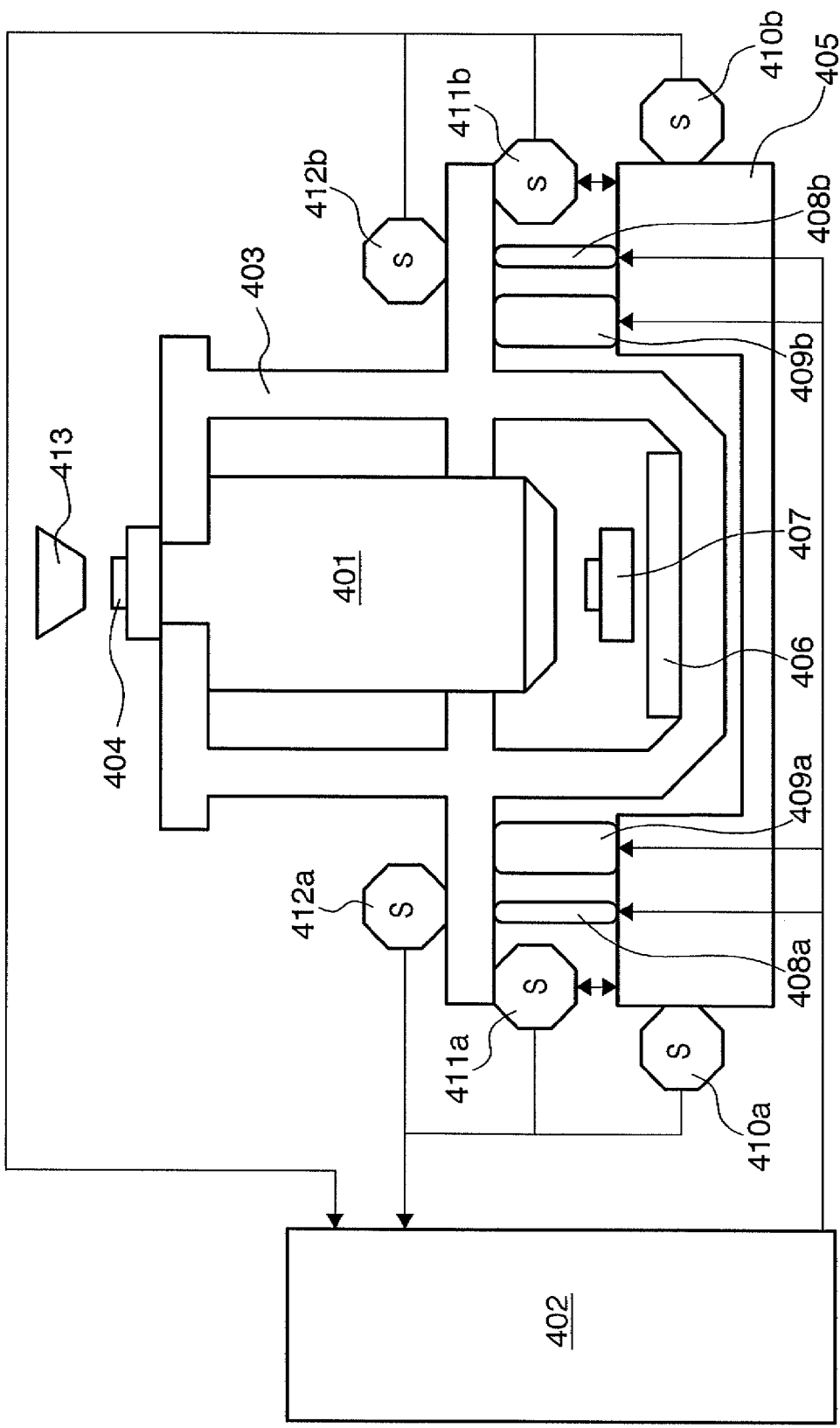
FIG. 4 is a view schematically showing a state when an exposure apparatus, according to an embodiment, is seen from the side.
Figure 5:
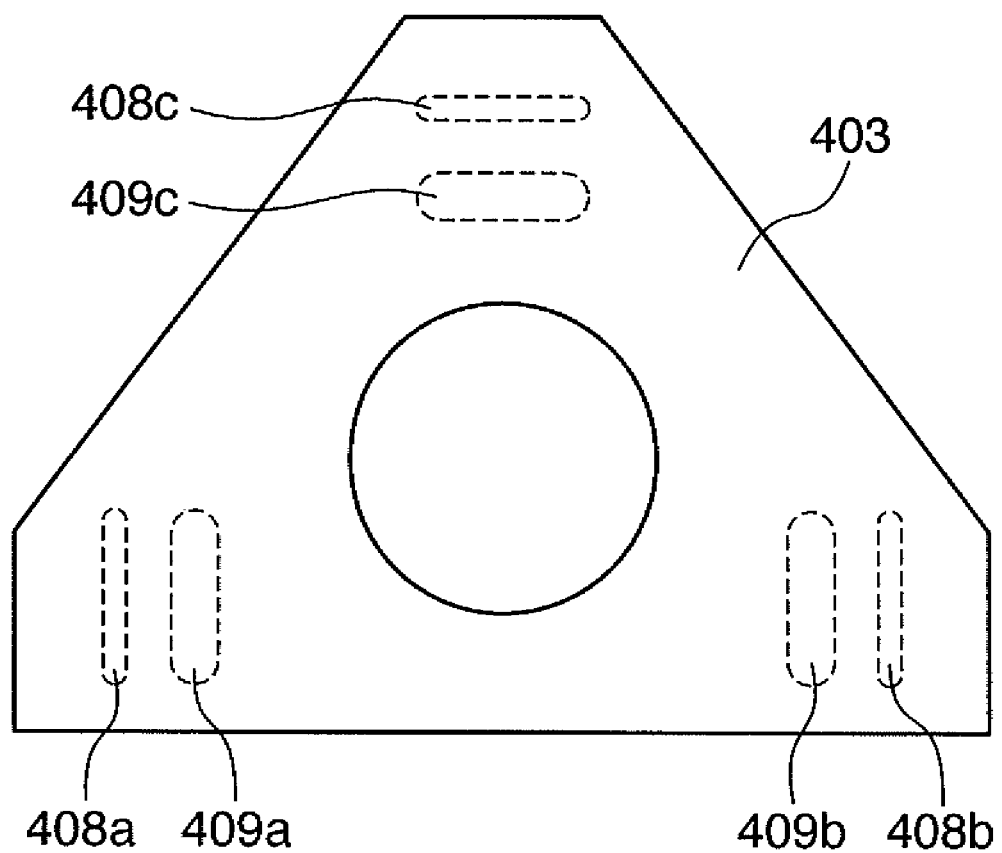
FIG. 5 is a view schematically showing the layout of actuators when an exposure apparatus, according to an embodiment, is seen from above.

An exposure apparatus according to the first embodiment will be explained first. FIG. 4 shows the schematic arrangement of the exposure apparatus according to this embodiment. FIG. 5 shows the arrangement and layout of a vibration isolation device built in the exposure apparatus.

As shown in FIGS. 4 and 5, a main body structure 403 of the exposure apparatus mounts a reticle stage 404, serving as an original stage, a wafer stage base 405, and a projection lens group 401. The main body structure 403 also mounts a wafer stage 407, serving as a substrate stage, via the wafer stage base 406. A laser irradiation unit 413 includes a light source, which emits a laser beam, and a mirror. A wafer is irradiated with, for example, a KrF or an ArF laser beam from the laser irradiation unit 413 via a reticle and the projection lens group 401, thereby printing the reticle pattern on the wafer. The main body structure 403 is supported by the vibration isolation devices.

A vibration isolation device, which is required to support a relatively heavy object, such as the one built in an exposure apparatus, and to isolate vibration at a high level, often uses a high-power, low-speed response actuator and a low-power, high-speed response actuator at the same time. In general, a high-power, low-speed response actuator implements control of the relative position and orientation between a support object and a floor. A low-power, high-speed response actuator implements skyhook damper control. In this embodiment, a low-power, high-speed response actuator will be referred to as a first actuator, and a high-power, low-speed response actuator will be referred to as a second actuator. This embodiment employs a pneumatic actuator as the high-power, low-speed response actuator, and an electromagnetic actuator as the low-power, high-speed actuator.

The vibration isolation device comprises electromagnetic actuators 408a to 408c and pneumatic actuators 409a to 409c. The electromagnetic actuators 408a to 408c will be generally referred to as an electromagnetic actuator 408, and the pneumatic actuators 409a to 409c will be generally referred to as a pneumatic actuator 409, hereafter. The vibration isolation device also comprises absolute vibration sensors 412a to 412c for detecting the absolute vibration of the main body structure 403, and absolute vibration sensors 410a to 410c for detecting the absolute vibration of a base frame 405. The vibration isolation device also comprises relative vibration sensors 411a to 411c for detecting the relative vibration between the main body structure 403 and the base frame 405. Each of the absolute vibration sensors 412a to 412c and 410a to 410c includes, for example, an accelerometer. Each of the relative vibration sensors 411a to 411c includes, for example, a position sensor. The absolute vibration sensors 412a to 412c, relative vibration sensors 411a to 411c, and absolute vibration sensors 410a to 410c will be generally referred to as an absolute vibration sensor 412, a relative vibration sensor 411, and an absolute vibration sensor 410, respectively.

The electromagnetic actuator 408 and pneumatic actuator 409 are interposed between the main body structure 403 and the base frame 405. A control unit 402 receives a signal from the vibration sensors 410 to 412 as the controlled variables, and outputs signals to the electromagnetic actuator 408 and pneumatic actuator 409 as the manipulated variables, thereby controlling the vibration isolation device. The control unit 402 performs, not only control of the vibration isolation device, but also, control of the overall apparatus, such as control of an exposure sequence. For illustrative convenience, the absolute vibration sensor 410c, relative vibration sensor 411c, and absolute vibration sensor 412c are not shown in FIG. 4.

Figure 1:
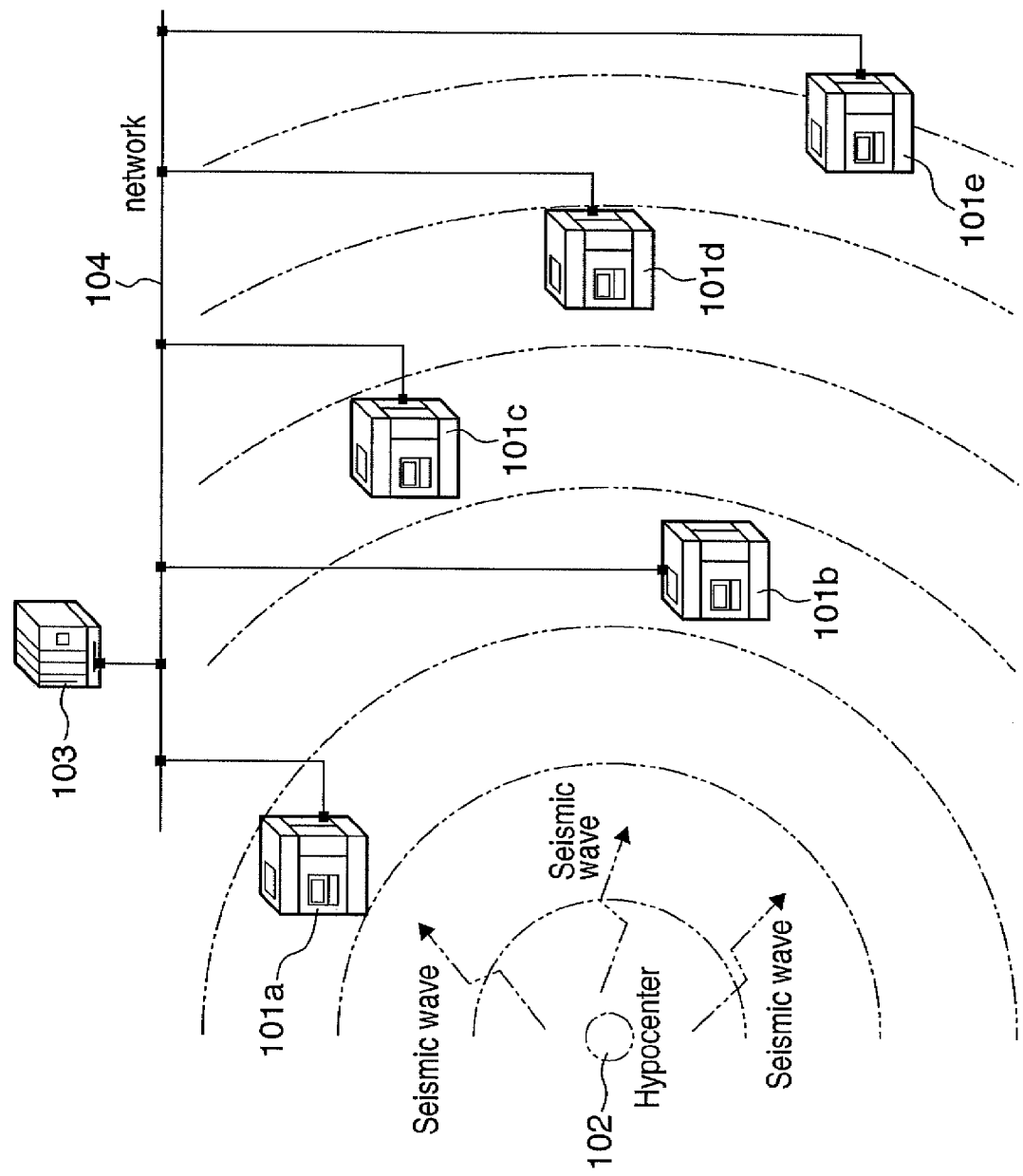
FIG. 1 is a schematic diagram showing a seismic warning network formed by a network of seismic stations using exposure apparatuses.
Figure 8:
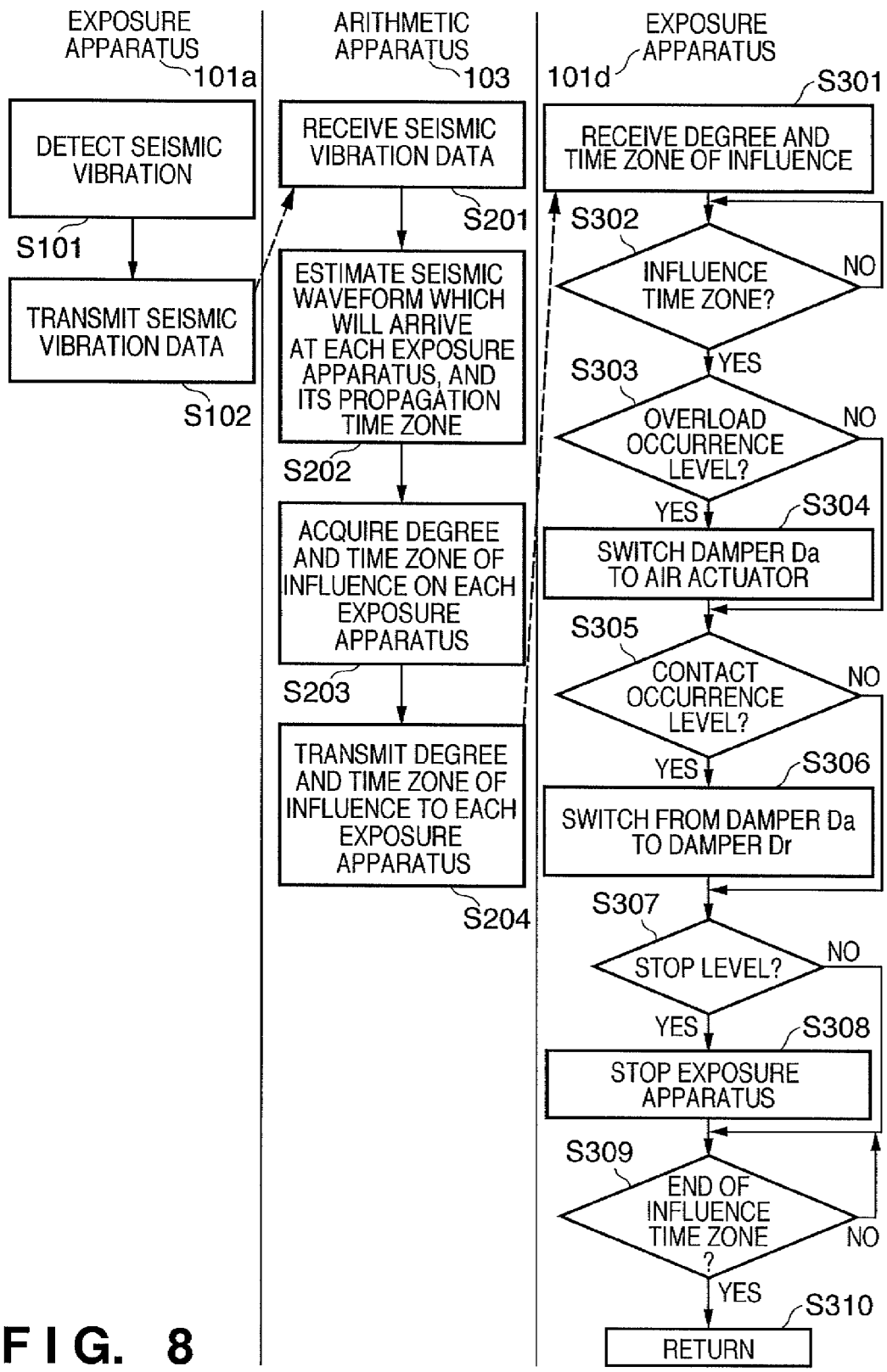
FIG. 8 is a flowchart for explaining the operation of a vibration isolation system according to the first embodiment.

The outline of a seismic warning network, which estimates the time at which seismic vibration arrives at each exposure apparatus and the time at which the seismic vibration dies down (influence time zone), and the degree of influence on the exposure apparatus, and a fault avoidance operation by an exposure apparatus (vibration isolation device), will be explained. FIG. 1 is a schematic diagram showing a seismic warning network, according to the first embodiment. The seismic warning network, including exposure apparatuses (vibration isolation device), constitutes a vibration isolation system. FIG. 8 is a flowchart illustrating a control procedure for avoiding any fault due to seismic vibration in the vibration isolation system according to this embodiment.

A seismic warning network is configured by connecting a network of seismic stations, an arithmetic apparatus 103 for estimating the influence on each vibration isolation device, and each exposure apparatus 101 (vibration isolation device) via a communication network 104. A network of seismic stations may be configured by using a public network of seismic stations or by connecting exposure apparatuses or vibration isolation devices to each other via a communication net. In the latter case, each exposure apparatus or vibration isolation device functions as a seismic observation device. In the first embodiment, the arrival of a seismic warning network using a public network of seismic stations will be described later in the second embodiment.

Referring to FIG. 1, exposure apparatuses 101a to 101e (also to be generally referred to as an exposure apparatus 101 hereafter), in respective regions around world, are connected to a communication network 104, such as the Internet or a satellite communication network. When seismic vibration occurs at a hypocenter 102, the exposure apparatus 101a, at a spot to which seismic vibration from the hypocenter 102 is transmitted in the shortest time among other exposure apparatuses, observes it first. The exposure apparatus 101a transmits seismic vibration data (seismic information) to an arithmetic apparatus 103, which performs arithmetic estimation processing associated with the arrival of seismic vibration. Based on the received seismic vibration data (seismic information), the arithmetic apparatus 103 estimates the degree and time zone of influence on the exposure apparatus 101 in each region around the world. The arithmetic apparatus 103 distributes the estimation result to an exposure apparatus 101 determined to come under adverse influence of the seismic vibration. Upon receiving the estimation result from the arithmetic apparatus 103, the exposure apparatus 101 notifies its operation of the estimation result and/or fault avoidance method, and automatically or manually executes fault avoidance control.

The arithmetic apparatus 103 performs the arithmetic estimation processing of the arrival of seismic vibration, not only once, but every time the exposure apparatus 101 in each region around the world transmits seismic vibration data (seismic information). For this reason, the arithmetic apparatus 103 always corrects the estimation of the degree of influence on the exposure apparatus 101 in each region around the world and the time zone (the arrival time and duration time of seismic vibration), and distributes the resultant estimation to the exposure apparatus 101. At various timings, such as the time point at which the exposure apparatus 101a observes a P-wave, the time point at which the exposure apparatus 101b observes a P-wave, the time point at which the exposure apparatus 101a observes an S-wave, and the time point at which the exposure apparatus 101a observes a surface wave, the exposure apparatus 101, which has observed each seismic wave, transmits seismic vibration data (seismic information) to the arithmetic apparatus 103. The arithmetic apparatus 103 then performs the arithmetic estimation processing of seismic vibration.

In the first embodiment, seismic vibration data (seismic information) is acquired by seismic observation using the absolute vibration sensor 410 mounted on the base frame 405 of the exposure apparatus 101. The arithmetic apparatus 103 is notified of the acquired data via the communication network 104. Note that even through the absolute vibration sensor 412, mounted on the main body structure 403, supported by the vibration isolation device, can observe seismic vibration, it can measure only low-frequency regions. The exposure apparatus may mount a vibration sensor dedicated to seismic vibration, such as a seismic observation device, to observe seismic vibration using it. As described above, when the exposure apparatus 101 (vibration isolation device) detects seismic vibration upon an earthquake (S101 in FIG. 8), it transmits seismic vibration data (seismic information) to the arithmetic apparatus 103 (S102).

As described above, seismic vibration data (seismic information) observed by the network of seismic stations is transmitted to the arithmetic apparatus 103, which estimates the influence on each exposure apparatus (vibration isolation device) via the communication network 104. Based on the received seismic vibration data (seismic information), the arithmetic apparatus 103 estimates the degree and time zone of influence on each exposure apparatus (vibration isolation device).

How to estimate the arrival and influence degree of seismic vibration by the arithmetic apparatus 103 will be explained. To estimate the arrival and influence degree of seismic vibration, a method of using a seismic vibration transmission model and a method of calculating the probability that a surface wave arrives will be exemplified.

The method of using a seismic vibration transmission model will be explained. A seismic vibration transmission model is created using the network of seismic stations shown in FIG. 1, and seismic vibration transmission is simulated using this model, thereby accurately estimating the arrival of seismic vibration at each exposure apparatus. The seismic vibration transmission model is obtained by calculating the vibration transmission time and vibration damping ratio between the observation points for each vibration frequency.

Referring to FIG. 1, the arithmetic apparatus 103 receives seismic vibration data (seismic information) of, for example, the exposure apparatus 101a (S201). Based on the received seismic vibration data (seismic information), the arithmetic apparatus 103 performs arithmetic estimation processing for estimating a seismic waveform which arrives at another exposure apparatus (e.g., the exposure apparatus 101d) and its propagation time (the time from seismic waveform arrival until seismic waveform propagation (S202). The arithmetic apparatus 103 performs this arithmetic estimation processing in accordance with, for example, the following procedure.

(1): Seismic vibration data (seismic information) obtained from the exposure apparatus 101a is transformed into seismic vibration data in the frequency domain by Fourier transformation.

(2): The amplitude attenuation and phase delay of seismic vibration data in the frequency domain are calculated for each frequency based on a seismic vibration transmission model created in advance for a system from a seismic observation point near the exposure apparatus 101a to that near the exposure apparatus 101d.

(3): The data obtained in (2) is restored to data in the time domain by inverse Fourier transformation to create a time-series seismic waveform (i.e., data indicating a seismic waveform and its propagation time zone) near the exposure apparatus 101d. The propagation time zone is used as the influence time zone.

Seismic observation data used to create such a seismic vibration transmission model can be acquired by, for example, the following three methods. That is, (1): a method of using a vibration sensor mounted in an exposure apparatus or a vibration isolation device, (2): a method of setting a seismic observation device for creating a seismic vibration transmission model, and (3): a method of using a public network of seismic stations.

It is also possible to use a combination of seismic vibration transmission models. Assume, for example, that the exposure apparatus 101c is located near the transmission path of seismic vibration between the exposure apparatus 101a, which has observed seismic vibration, and the exposure apparatus 101d for which its influence is to be calculated. In this case, a seismic vibration transmission model between the exposure apparatuses 101a and 101d may be created by combining a seismic vibration transmission model between the exposure apparatuses 101a and 101c and that between the exposure apparatuses 101c and 101d.

Seismic observation data used to create a seismic vibration transmission model preferably has a vibration amplitude at each frequency as large as that obtained upon an earthquake. Instead of obtaining seismic observation data upon an occurrence of an earthquake, it can also be obtained by artificially generating seismic vibration using a bomb, dynamite, or a large-scale vibration generator. Seismic observation data used to create a seismic vibration transmission model can also be obtained by, for example, using a vibration sensor mounted in an exposure apparatus, setting a seismic observation device for creating a seismic vibration transmission model, or using a public network of seismic stations. In a region in which an earthquake (P- and S-waves) rarely occurs, the use of a public network of seismic stations alone is often insufficient to obtain seismic observation data. In this case, a seismic observation device is newly set to create a seismic vibration transmission model.

The arithmetic apparatus 103 estimates the degree of influence on each exposure apparatus, based on information indicating the above-described seismic waveform (S203).

The degree of influence of seismic vibration on each exposure apparatus is estimated by simulation using the time-series seismic waveform obtained by the above-described method and an exposure apparatus model to be described hereafter. The arithmetic apparatus 103 holds the following exposure apparatus model for each exposure apparatus.

An exposure apparatus model may be created by vibrating a floor on which an actual apparatus is installed and calculating a vibration transfer function for each position, or may be created by combining functions, each obtained by calculating the transfer ratio of each local region and approximating (identifying) the measurement result. More preferably, this model takes account of the building itself, in which the exposure apparatus is installed.

The arithmetic apparatus 103 estimates and acquires the degree of influence of the seismic vibration on each exposure apparatus by the above-described simulation, based on the seismic waveform. The arithmetic apparatus 103 then transmits the acquired degree and time zone of influence to a corresponding exposure apparatus (S204). Examples of the estimated influence degree are (1): the level at which an overload is imposed on the electromagnetic actuator 408, (2): the level at which the main body structure 403 comes into contact with the base frame 405, and (3): the level at which the exposure apparatus needs to stop.

A vibration isolation device of an exposure apparatus is required to support a main body structure with a weight of several tons, and to isolate vibration at a high level. Such a vibration isolation device generally uses a combination of a high-power, low-speed response actuator, such as a pneumatic actuator and a low-power, high-speed response actuator, such as an electromagnetic actuator. The first embodiment employs a vibration isolation device as a combination of the pneumatic actuator 409 and the electromagnetic actuator 408. In the first embodiment, the pneumatic actuator 409 is a pneumatic actuator, including an air spring and a solenoid servo valve, and the electromagnetic actuator 408 is a non-contact linear motor.

Figure 3:
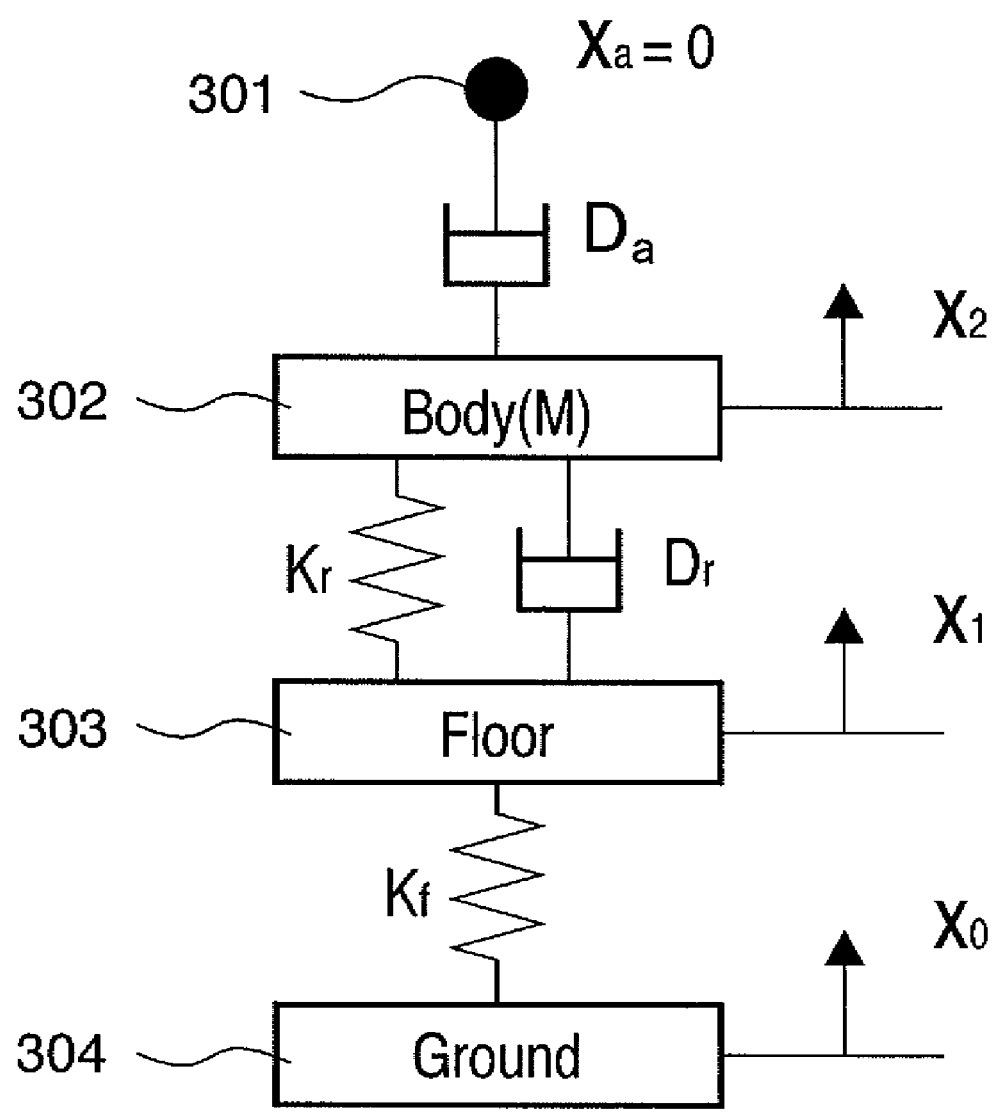
FIG. 3 is a diagram illustrating a seismic vibration transmission system from the ground to an exposure apparatus, using springs, masses, and dampers.

FIG. 3 is a diagram illustrating a vibration transmission system from a ground 304 to a main body structure 302 (corresponding to the main body structure 403) of an exposure apparatus, using a spring/mass/damper model. Referring to FIG. 3, a damper Da between an absolute still point 301 and the main body structure 302 of the exposure apparatus is a system called a skyhook damper. The skyhook damper feeds back a signal from the absolute vibration sensor 412 to the electromagnetic actuator 408 via the control unit 402 to dampen vibration of the main body structure 302 with respect to the absolute still point 301.

A spring Kr acts between the main body structure 302 and a floor 303 (corresponding to the base frame 405), on which the exposure apparatus is installed. The spring Kr feeds back the mechanical spring characteristic of the pneumatic actuator 409 and a signal from the relative vibration sensor 411 to the pneumatic actuator 409 via the control unit 402. In a normal operation, a damper Dr between the main body structure 302 of the exposure apparatus and the floor 303, on which the exposure apparatus is installed, is set to nearly zero, and the above-described skyhook damper Da and spring Kr constitute a vibration isolation mechanism.

In practice, a spring Kf between the ground 304 and the floor 303, on which the exposure apparatus is installed, exhibits a characteristic obtained by connecting a large number of springs and masses in series. The main resonance frequency of the spring Kf is normally about 10 Hz to 20 Hz. However, the natural frequency of the spring Kf in the horizontal direction is sometimes about 0.05 Hz in a building with a seismic isolation structure. Since this characteristic amplifies surface waves, it is necessary to set it in the arithmetic apparatus as a model in the above-described simulation in step S203.

When the floor 303 on which the exposure apparatus is installed largely shakes upon seismic vibration, the damper Da between the absolute still point 301 and the main body structure 302 of the exposure apparatus controls the main body structure 302 of the exposure apparatus to be absolutely still. This increases an overload imposed on the electromagnetic actuator 408 of the damper Da. Since the electromagnetic actuator 408 exhibits a relatively low power and high response speed, it cannot withstand a large shake, such as seismic vibration of the floor 303, on which the exposure apparatus is installed. When seismic vibration, which generates a surface wave with ultralow frequencies, occurs, the effective value of a command current supplied to the electromagnetic actuator 408 increases, so that the electromagnetic actuator 408 abnormally overheats. This state applies to "the level at which an overload is imposed on the electromagnetic actuator 408" described above.

If the electromagnetic actuator 408 can withstand the load, a part (e.g., a stopper) of the main body structure 302 of the exposure apparatus, which is absolutely still, may come into contact with the floor 303 on which the exposure apparatus is installed, and which is shaking upon seismic vibration. This state applies to "the level at which the main body structure 403 comes into contact with the base frame 405" described above.

If the seismic vibration is large enough that the operation of the exposure apparatus cannot continue (e.g., if an S-wave arrives), this state applies to "the level at which the exposure apparatus needs to stop", and the degree of influence is determined.

As described above, it is possible to accurately estimate the arrival of seismic vibration by creating a seismic vibration transmission model using a network of seismic stations and performing simulation using this model.

The method of estimating the arrival and degree of influence of seismic vibration by calculating the probability that a surface wave will arrive will be explained. A known method of calculating a probability E that a surface wave will arrive is as follows. In this method, the probability that seismic vibration, which is expected to adversely affect an exposure apparatus or a vibration isolation device, arrives, is empirically calculated based on pieces of information on the magnitude of an earthquake, the depth of the hypocenter, the hypocentral position, and the time of occurrence of the earthquake distributed from, for example, a research institute for seismology or a meteorological institute. Based on three pieces of information on a moment magnitude Mw, a depth H of a hypocenter, and a hypocentral distance L, the probability E that a surface wave which, is expected to cause an abnormality in the exposure apparatus or a vibration isolation device, will arrive, is calculated by:

$$\begin{cases} a = Mw/Mw_{100} & (Mw < Mw_{100}) \\ a = 1 & (Mw \geq Mw_{100}) \end{cases} \quad (1a)$$

-continued $$\begin{cases} b = (H_{100} - H)/H_{100} & (H \geq 30) \\ b = 1 & (H < 30) \end{cases} \quad (1b)$$

$$\begin{cases} c = (L_{100} - L)/L_{100} & (L \geq 100000) \\ c = 1 & (L < 100000) \end{cases} \quad (1c)$$

$$E = a^2 \cdot b \cdot c \times 100 \; [\%]. \quad (1d)$$

The coefficients $Mw_{100}$, $H_{100}$, and $L_{100}$ are determined in accordance with the seismic resistance against a surface wave of an exposure apparatus or a vibration isolation device, including an environment under which it is installed. The variable c in equation (1c) is set to be more than 0.5. The arrival time (influence time zone) of seismic vibration can be estimated in accordance with the propagation velocity of a surface wave. Although the "Real-time seismology" article discussed above describes the propagation velocities of P- and S-waves, the velocity of a surface wave can be calculated in the same way.

In the above-described equations (1a) to (1d), appropriate values are selected for the coefficients $Mw_{100}$, $H_{100}$, and $L_{100}$ determined in accordance with the seismic resistance against a surface wave. This makes it possible to obtain the probability E that a surface wave, which is expected to have an influence corresponding to each level described above on an exposure apparatus or a vibration isolation device, arrives. For example, when the probability E becomes 20% or more, a corresponding exposure apparatus is notified of the degree of influence.

As described above, based on the three pieces of information on the moment magnitude Mw, the depth H of hypocenter, and the hypocentral distance L, the probability E that a surface wave, which is expected to cause an abnormality in an exposure apparatus or a vibration isolation device, will arrive, is calculated, to obtain the degree of influence. This makes it possible to easily determine, at a low cost, whether the surface wave will cause an abnormality in the exposure apparatus or vibration isolation device.

A fault avoidance operation by an exposure apparatus (vibration isolation device), which has received the degree and time zone of influence from the arithmetic apparatus 103, will be explained. When the control unit 402 of the exposure apparatus receives the degree and time zone of influence from the arithmetic apparatus 103 (S301), it waits until the influence time zone comes (S302). The arithmetic apparatus 103 may transmit the degree of influence to the exposure apparatus at the influence time zone. This obviates the need for the waiting in step S302.

A case in which the received influence degree applies to "the level at which an overload is imposed on the electromagnetic actuator 408" will be exemplified.

If it is determined that an overload is imposed on the electromagnetic actuator 408 (the electromagnetic actuator 408 abnormally overheats), an actuator which implements the damper Da between the absolute still point 301 and the main body structure 302 of the exposure apparatus is switched during the overheating abnormality occurrence time (S303, S304, and S309). The overheating abnormality occurrence time herein means the time until the influence time zone ends. More specifically, the vibration isolation mode is switched by switching an actuator which implements the damper Da from the electromagnetic actuator 408 to the pneumatic actuator 409. Since switching is performed from a linear motor to a pneumatic actuator with a relatively nonlinear characteristic, the vibration isolation characteristic of the damper Da deteriorates. This deterioration poses no problem if the pattern line width of a mask is not so fine, or the required overlay exposure is not so high. If the switching of the vibration isolation mode poses no problem, as in this case, the exposure sequence continues. Otherwise, the exposure sequence stops, so that the apparatus enters an idling state.

A case in which the received influence degree applies to "the level at which the main body structure 403 comes into contact with the base frame 405" will be exemplified. In this case, it is determined in the model shown in FIG. 3 that the main body structure 302 of the exposure apparatus is at risk for coming into contact with the floor 303 on which the exposure apparatus is installed. Upon receiving this influence degree, the control unit 402 turns off absolute vibration damping control by, for example, a skyhook damper, and turns on relative vibration damping control during the influence time zone (S305, S306, and S309). More specifically, the vibration isolation mode is switched by setting the damper Da to nearly zero, and setting the damper Dr to an active state, in FIG. 3. The damper Dr feeds back the difference between signals from the absolute vibration sensors 412 and 410 or a signal from the relative vibration sensor 411 to the electromagnetic actuator 408 and/or pneumatic actuator 409 via the control unit 402. Even though vibration of the floor 303, on which the exposure apparatus is installed, is readily transmitted to the main body structure 302 of the exposure apparatus, its frequency falls within about 30 Hz, beyond which exposure is particularly, adversely affected. The exposure sequence is, therefore, not adversely affected, as long as the floor 303 on which the exposure apparatus is installed is shaking only by a surface wave. The exposure sequence continues, even after switching the vibration isolation mode. The control unit 402 performs this determination by comparing the frequency characteristics of a signal from the absolute vibration sensor 410 with its threshold value set in advance.

If it is estimated that unavoidable seismic vibration which generates, for example, an S-wave upon a huge earthquake will arrive, the control unit 402 receives the degree of influence which applies to "the level at which an exposure apparatus needs to stop". The control unit 402 controls operation to stop all the sequences by the exposure apparatus in the time zone during which an unavoidable seismic vibration arrives (S307, S308, and S309).

As described above, when it is estimated or detected that seismic vibration, which adversely affects an exposure apparatus or a vibration isolation device, will arrive, the vibration isolation mode of the vibration isolation device is switched in accordance with the level of the seismic vibration. Although a case in which a skyhook damper control using the damper Da is applied to control the vibration isolation device has been exemplified above, it is also possible to apply a skyhook spring control or a floor vibration feed-forward control system to it.

In the above-described way, the vibration isolation mode is changed to avoid any fault. After that, as the received influence time zone elapses, the control unit 402 returns the vibration isolation mode to the initial state (S310). However, if a large-scale earthquake which generates a surface wave occurs, a situation in which:

no problem is posed even when the apparatus returns from an earthquake avoidance state to a normal state, and the apparatus needs to be set to an earthquake avoidance state again, after several minutes is estimated, to repeatedly occur several times. In view of this, the control unit 402 not only estimates the above-described time during which the exposure apparatus is abnormal, but also, estimates the time until the exposure apparatus generates a next abnormality (or receives the next influence time zone from the arithmetic apparatus 103). Based on this estimation, the control unit 402 determines whether the throughput of the exposure apparatus can improve more when the apparatus returns to a normal state, or when it continues to be in an earthquake avoidance state. Based on this determination, the control unit 402 determines whether to return the apparatus (vibration isolation device) to a normal state.

As has been described above, according to the first embodiment, the vibration isolation device can be activated in a plurality of vibration isolation modes. The control unit 402 acquires estimate information (influence degree) representing whether a fault occurs due to vibration upon seismic vibration, or the like, from, for example, the arithmetic apparatus 103. In a normal operation, the control unit 402 activates the vibration isolation device in a first vibration isolation mode, in which absolute vibration damping control is used. Based on the estimate information, the control unit 402 switches the vibration isolation mode of the vibration isolation device to a second vibration isolation mode. Examples of the second vibration isolation mode are a vibration isolation mode in which an actuator of the damper Da is switched from an electromagnetic actuator to a pneumatic actuator, and a vibration isolation mode in which relative vibration damping control for setting the damper Da to zero, and setting the damper Dr to an active state is used. In this way, the vibration isolation device according to this embodiment dampens vibration transmitted from the base frame 405, or the floor 303 on which the apparatus is installed, to the main body structure 302 or 403 as the support object. This device can effectively avoid any fault that occurs due to vibration upon seismic vibration.

The control unit 402 of the exposure apparatus (vibration isolation device) may perform estimation of the degree of influence, which is executed by the arithmetic apparatus 103 in step S203 in the above description. In this case, the control unit 402 receives seismic waveform data from the arithmetic apparatus 103, and determines the influence degree by controlling the model, as shown in FIG. 3, based on this data.

Second Embodiment

In the first embodiment, a seismic warning network is formed by forming a network of seismic stations using exposure apparatuses. The second embodiment will exemplify a case in which a seismic warning network is formed using a public network of seismic stations. The arrangement of an exposure apparatus according to the second embodiment is the same as that (FIGS. 4 and 5) in the first embodiment.

Figure 2:
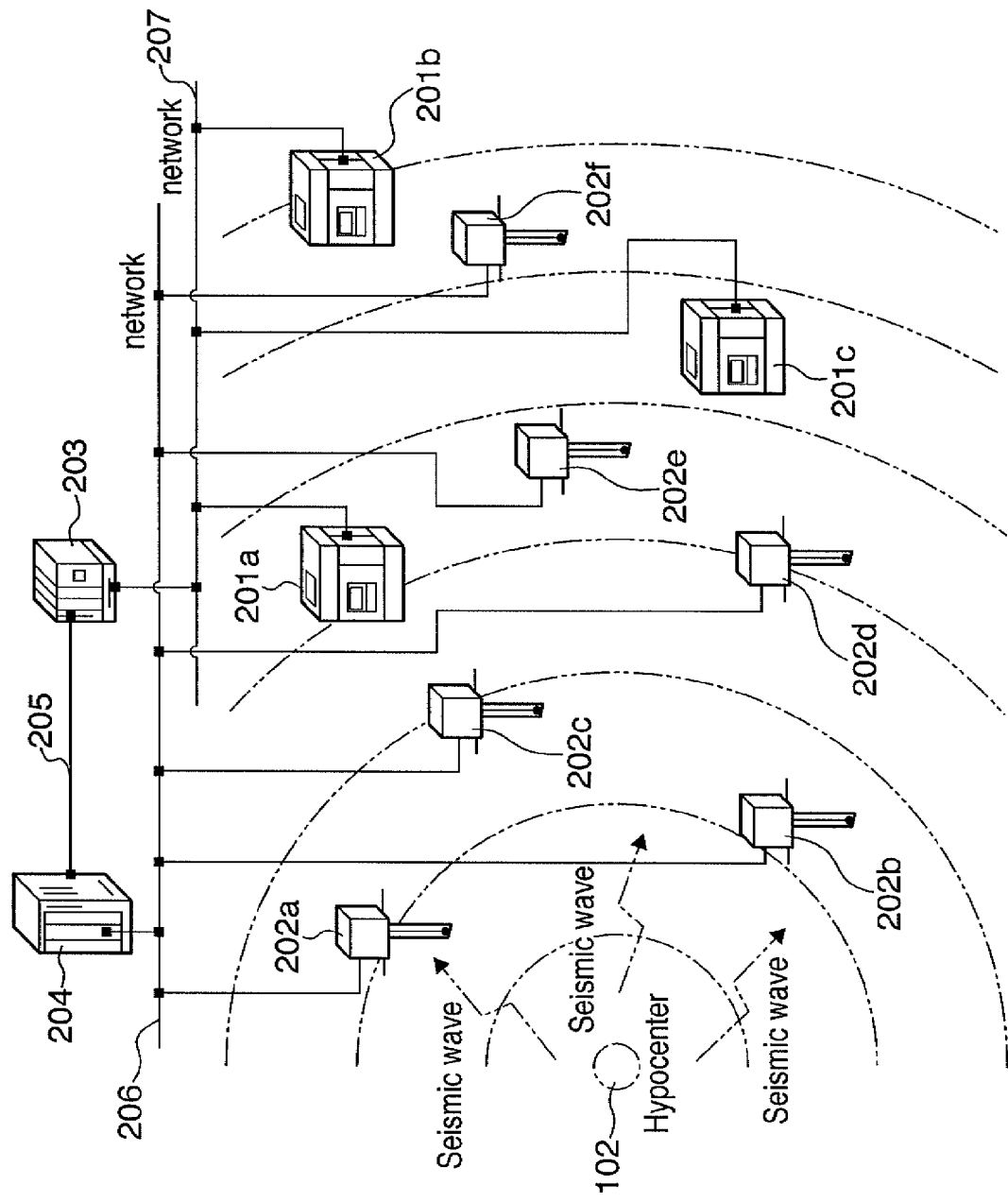
FIG. 2 is a schematic diagram showing a seismic warning network using a public network of seismic stations according to the second embodiment.

The outline of a seismic warning network according to the second embodiment will be explained. FIG. 2 shows the outline of the seismic warning network according to the second embodiment.

Referring to FIG. 2, seismic observation devices 202a to 202f and exposure apparatuses 201a to 201c, in respective regions around the world are connected to communication networks 206 and 207, respectively, such as the Internet or a satellite communication network. When the seismic vibration occurs at a hypocenter 102, the seismic observation device 202a at a spot to which seismic vibration from the hypocenter 102 is transmitted in the shortest time among other seismic observation devices observes it first. The seismic observation device 202a transmits seismic vibration data (seismic information) to a management system 204 of a network of seismic stations (to be referred to as a management system 204 hereafter) via the communication network 206. The management system 204 directly transmits seismic vibration data (seismic information) to an arithmetic apparatus 203 via a communication network 205. Based on the seismic vibration data (seismic information), the arithmetic apparatus 203 estimates the degree and time zone of influence on the exposure apparatus 201 in each region around the world. The arithmetic apparatus 203 distributes the estimation result to an exposure apparatus 201 determined to come under adverse influence of the seismic vibration. Upon receiving the estimation result, the exposure apparatus 201 notifies its operator of the estimation result and/or fault avoidance method, and automatically or manually executes fault avoidance control.

The arithmetic apparatus 203 performs the above-described arithmetic estimation processing, not only once, but every time the management system 204 in each region around the world transmits seismic vibration data (seismic information). In this way, the arithmetic apparatus 203 always corrects the estimation of the degree of influence on the exposure apparatus 201 in each region around the world and the time zone (the arrival time and duration time of the seismic vibration), and distributes the resultant estimation to the exposure apparatus 201.

The seismic observation device 202 will be explained. Examples of a public network of seismic stations in Japan are Kyoshin Network K-NET, High-Sensitivity Seismograph Network Hi-net, and Digital Strong-Motion Seismograph Network KiK-net opened to the public by the National Research Institute for Earth Science and Disaster Prevention. Examples of a network of seismic stations outside Japan are the International Seismic Network, WWSSN, and IRIS. WWSSN is World-Wide Standardized Seismograph Network, and IRIS is Incorporated Research Institutions for Seismology. The second embodiment employs these networks of seismic stations. Since these networks of seismic stations use different seismic waveform observation devices and data formats, the arithmetic apparatus 203 needs to perform different data correction for the respective networks of seismic stations. The characteristic of each seismic observation device can be corrected by filtering seismic vibration data (seismic information) by the inverse function of the characteristic of the seismic observation device. The seismic observation device used for each network of seismic stations often has a speedometer and an accelerometer with a mechanical spring pendulum structure or a movable coil structure, and information on the device is open to the public. Examples of the data format are SAC (Seismology-AidedCode), AH (ad-hoc), SEED (Standard for the Exchange of Earthquake Data), and WIN.

An earthquake arrival estimation method, a method of estimating the influence on an exposure apparatus, a fault avoidance method for a vibration isolation device, and a method of returning the exposure apparatus and vibration isolation device from a fault avoidance state to a normal state are the same as those in the first embodiment.

As has been described above, according to the second embodiment, it is possible to form a seismic warning network at a low cost by adopting a public network of seismic stations and a network of seismic stations using the above-described exposure apparatus or vibration isolation device.

Third Embodiment

An embodiment of a system which issues a warning to the operator of a vibration isolation device based on the magnitude of an earthquake, the depth of a hypocenter, the hypocentral position, and the occurrence time of the earthquake announced by a research institute will be explained next. If an exposure apparatus according to this embodiment determines that seismic vibration will adversely affect the exposure apparatus or isolation vibration device, it notifies its operator of information associated with this determination. This information is recorded in the apparatus or a management system of the apparatus.

As an earthquake occurs, the network of seismic stations or meteorological institute described in the first and second embodiments announces pieces of information on the magnitude of the earthquake, the depth of the hypocenter, the hypocentral position, and the occurrence time of the earthquake.

Referring to FIG. 2, an arithmetic apparatus 203 receives information on the magnitude of an earthquake, the depth of a hypocenter, the hypocentral position, and the occurrence time of the earthquake distributed from a management system 204. The arithmetic apparatus 203 converts the magnitude information into a moment magnitude. If the moment magnitude and the depth of the hypocenter satisfy a predetermined condition, the arithmetic apparatus 203 notifies the operators of all exposure apparatuses of pieces of information on the magnitude of the earthquake, the depth of the hypocenter, the occurrence time of the earthquake via a communication network 207 of exposure apparatuses 201. Examples of the predetermined condition are a case in which the moment magnitude is five or more and the depth of hypocenter is 100 m or less, and a case in which the moment magnitude is six or more and the depth of focus is 150 m or less.

Based on the distance from the hypocenter to the exposure apparatus 201 in each region around the world, the arithmetic apparatus 203 calculates the probability that a surface wave, which is expected to cause an abnormality in the exposure apparatus 201, arrives. The arithmetic apparatus 203 notifies the operator of the exposure apparatus 201 of the calculated probability, together with the above-described information. A probability E that a surface wave, which is expected to cause an abnormality in the exposure apparatus 201 arrives, is calculated in accordance with the above-described equation (1) based on three pieces of information on a moment magnitude M2, a depth H of the hypocenter, and a hypocentral distance L. The third embodiment assumes $Mw_{100}=7$, $H_{100}=200$, and $L_{100}=8\times10^7$.

As has been described above, according to the third embodiment, the operator of an exposure apparatus or vibration isolation device is notified of information associated with seismic vibration. This makes it possible to more quickly perform seismic vibration avoidance or an apparatus returning operation. This information is recorded in the apparatus or a management system of the apparatus. This makes it possible to promptly specify the cause of any apparatus fault, such as exposure failure.

Fourth Embodiment

An exposure apparatus according to the fourth embodiment will be explained next. In the fourth embodiment, a system which switches a control mode by detecting an overheating abnormality of a low-power actuator in a vibration isolation device with a hybrid arrangement of a high-power actuator and a low-power actuator will be explained.

As described above, since an electromagnetic actuator exhibits a relatively low power and high response speed, an overload is readily imposed on it upon an unexpected disturbance due to an earthquake. To solve this problem, a thermometer is attached to an electromagnetic actuator. If the measurement value of the temperature of the electromagnetic actuator is determined to be abnormal, a control mode is switched from skyhook damper control (damper Da) to control using a high-power, low-speed response pneumatic actuator. After the temperature returns to a normal state, the control mode is returned from skyhook damper control to control using an electromagnetic actuator.

Figure 6:
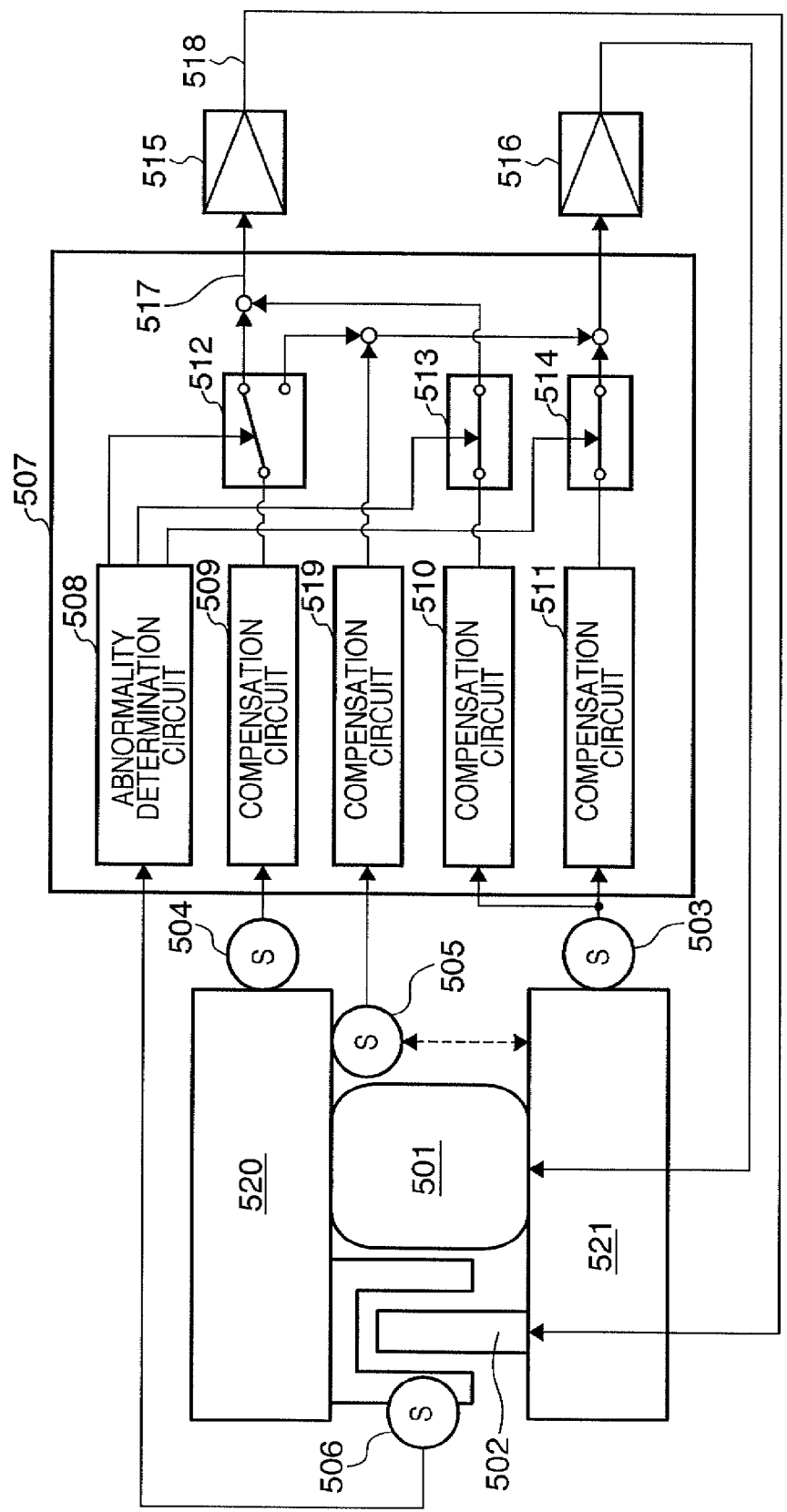
FIG. 6 is a block diagram showing a control system of an active vibration isolation device having a temperature abnormality determination circuit of an actuator, according to the fourth embodiment.

FIG. 6 shows the outline of an active vibration isolation device according to the fourth embodiment. Referring to FIG. 6, the active vibration isolation device includes an observation part, a control part, and an actuator part. The observation part has an absolute vibration sensor 504 for a support object 520, an absolute vibration sensor 503 for a base frame 521 which supports the vibration isolation device, and a relative vibration sensor 505 for the support object 520 and the base frame 521. The control part has a control unit 507 formed by an electrical circuit. The actuator part has a high-power, low-speed response pneumatic actuator 501, a low-power, high-speed response electromagnetic actuator 502, and drivers 516 and 515, which generate command signals for the actuators 501 and 502, respectively. A thermometer 506 measures the temperature of the electromagnetic actuator 502.

The control unit 507 comprises an absolute vibration control system for the support object 520, a relative vibration control system for the support object 520 and the base frame 521, and an overheating abnormality avoidance system for the electromagnetic actuator 502.

In a normal state, the absolute vibration control system for the support object 520 controls a compensation circuit 509 to generate an actuating signal for the driver 515 based on a signal from the absolute vibration sensor 504 to actuate the electromagnetic actuator 502. If an abnormality determination circuit 508 detects an overheating abnormality of the electromagnetic actuator 502 based on a signal from the thermometer 506, it switches a switch 512 so as to send the actuating signal form the compensation circuit 509 to the driver 516. With this operation, the actuator of the absolute vibration control system for the support object 520 is switched form the electromagnetic actuator 502 to the pneumatic actuator 501.

The relative vibration control system for the support object 520 and the base frame 521 controls a compensation circuit 519 to generate an actuating signal for the driver 516 based on a signal from the relative vibration sensor 505 to actuate the pneumatic actuator 501. The control mode of this system is not changed between a normal state and an abnormal state.

The absolute vibration control system for the base frame 521 includes two subsystems. One subsystem controls a compensation circuit 510 to generate an actuating signal for the driver 515 based on a signal from the absolute vibration sensor 503 to actuate the electromagnetic actuator 502. If the abnormality determination circuit 508 detects an overheating abnormality of the electromagnetic actuator 502, it switches a switch 513 from ON to OFF. Another absolute vibration control subsystem for the base frame 521 controls a compensation circuit 511 to generate an actuating signal for the driver 516, based on a signal from the absolute vibration sensor 503 to actuate the pneumatic actuator 501. If the abnormality determination circuit 508 detects an overheating abnormality of the electromagnetic actuator 502, it switches a switch 514 from ON to OFF. Upon turning off the switch 514, absolute vibration feed-forward control from the floor to the pneumatic actuator 501 is also turned OFF.

Although the abnormality determination circuit 508 determines whether the electromagnetic actuator 502 has an abnormality based on an observation signal from the thermometer 506 attached to the electromagnetic actuator 502, the present invention is not limited to this. If it is difficult to attach a thermometer to an electromagnetic actuator, the temperature of the electromagnetic actuator may be calculated by arithmetic temperature estimation processing based on its manipulated variable. That is, the abnormality determination circuit 508 may determine whether the electromagnetic actuator 502 has an abnormality by performing arithmetic temperature estimation processing based on an actuating signal 517 for the driver 515 and a current signal 518 for the electromagnetic actuator 502. Note that it is necessary to ensure an environment under which the temperature (initial temperature) of an electromagnetic actuator is maintained almost constant when it is OFF, and to experimentally calculate the temperature rise coefficient and heat dissipation coefficient (arithmetic temperature estimation processing coefficients) in advance. If it is difficult to attach a thermometer to an electromagnetic actuator and no electrical circuit for arithmetic temperature estimation processing is available, an abnormality of an electromagnetic actuator may be determined based on its manipulated variable.

As has been described above, according to the fourth embodiment, if the temperature of an electromagnetic actuator is determined to be abnormal, a control mode is switched from skyhook damper control and skyhook spring control to control using a high-power, low-speed response pneumatic actuator. Using the exposure apparatus according to the fourth embodiment as the exposure apparatus according to each of the first to third embodiments makes it possible to form a system with a stronger seismic resistance.

Fifth Embodiment

In the fifth embodiment, a system which switches a control mode based on a signal output from a floor vibration sensor in an active vibration isolation device having a floor vibration feed-forward control system will be explained.

A vibration isolation device required to isolate vibration at high levels such as the one built in an exposure apparatus includes a skyhook damper control system and a floor vibration feed-forward system. In rare cases, the vibration isolation device also includes a skyhook spring control system.

Seismic vibration may be detected based on the manipulated variable of the skyhook damper control system, skyhook spring control system, or floor vibration feed-forward control system. This is because the manipulated variable of a control system is the product of the controlled variable and the transfer function of a compensator, so that he controlled variable is calculated by multiplying the inverse transfer function of the compensator by the manipulated variable.

The controlled variables of the skyhook damper control system and skyhook spring control system are the absolute vibration of a support object of a vibration isolation device. It is, therefore, possible to calculate the absolute vibration of a floor in which the vibration isolation device is installed by multiplying the controlled variables of the skyhook damper control system and skyhook spring control system by the inverse function of the vibration transfer function for a system from the floor on which the vibration isolation device is installed to the support object of the vibration isolation device. This makes it possible to determine whether the absolute vibration level of the floor on which the vibration isolation device is installed is abnormal.

The controlled variable of the floor vibration feed-forward control system is the absolute vibration of the floor on which the vibration isolation device is installed. It is, therefore, possible to determine whether the absolute vibration level of the floor on which the vibration isolation is installed is abnormal.

Figure 7:
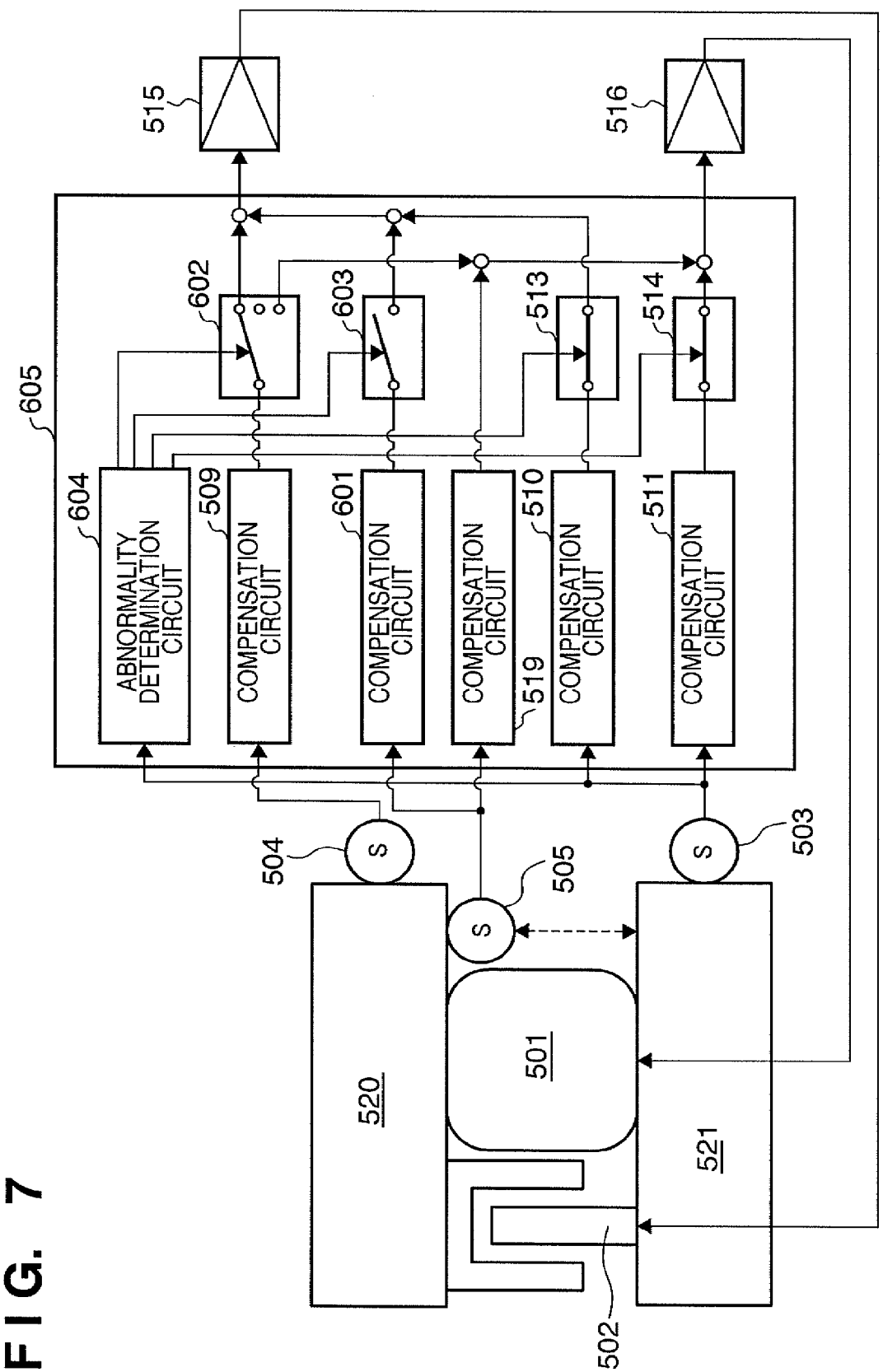
FIG. 7 is a block diagram showing a control system of an active vibration isolation device having a floor vibration abnormality determination circuit, according to the fifth embodiment.

FIG. 7 shows the outline of an active vibration isolation device according to the fifth embodiment. Referring to FIG. 7, the active vibration isolation device includes an observation part, a control part, and an actuator part. The observation part has an absolute vibration sensor 504 for a support object 520, an absolute vibration sensor 503 for a base frame 521, which supports the vibration isolation device, and a relative vibration sensor 505 for the support object 520 and the base frame 521. The control part has a control unit 605 formed by an electrical circuit. The actuator part has a high-power, low-speed response pneumatic actuator 501, a low-power, high-speed response electromagnetic actuator 502, and drivers 516 and 515, which generate command signals for the actuators 501 and 502, respectively.

The control unit 605 comprises an absolute vibration control system for the support object 520, a relative vibration control system for the support object 520 and the base frame 521, and an absolute vibration abnormality avoidance system for the base frame 521.

In a normal state, the absolute vibration control system for the support object 520 controls a compensation circuit 509 to generate an actuating signal for the driver 515 based on a signal from the absolute vibration sensor 504 to actuate the electromagnetic actuator 502. In a normal state, the relative vibration control system for the support object 520 and the base frame 521 controls a compensation circuit 519 to generate an actuating signal for the driver 516 based on a signal from the relative vibration sensor 505 to actuate the pneumatic actuator 501. The absolute vibration control system for the base frame 521 includes two subsystems. One subsystem controls a compensation circuit 510 to generate an actuating signal for the driver 515 based on a signal from the absolute vibration sensor 503 to actuate the electromagnetic actuator 502. Another subsystem controls a compensation circuit 511 to generate an actuating signal for the driver 516 based on a signal from the absolute vibration sensor 503 to actuate the pneumatic actuator 501.

In the fifth embodiment, an abnormality determination circuit 604 can detect an absolute vibration abnormality of the base frame 521, as described above. The abnormality determination circuit 604 switches the operation of a vibration isolation device between four vibration isolation modes for each stage of the detected abnormality.

In the first stage, the abnormality determination circuit 604 switches a switch 602 so as to send a signal from the compensation circuit 509 to the driver 516, and switches switches 513 and 514 from ON to OFF. Upon turning off the switch 514, absolute vibration feed-forward control from the floor to the pneumatic actuator 501 is also turned off. With this operation, the actuator of the absolute vibration control system for the support object 520 is switched from the electromagnetic actuator 502 to the pneumatic actuator 501, and the absolute vibration control system for the base frame 521 is turned off.

In the second stage subsequent to the first stage, the abnormality determination circuit 604 turns off the switch 602 to turn off the absolute vibration control system for the support object 520, and turns on a switch 603. With this operation, a new relative vibration control system is formed for the support object 520 and the base frame 521. The relative vibration control system controls a compensation circuit 601 to generate an actuating signal for the driver 515 on the basis of a signal from the relative vibration sensor 505 to actuate the electromagnetic actuator 502. The relative vibration control system for the support object 520 and the base frame 521 controls the distance between them using the pneumatic actuator 501. The relative vibration control system for the support object 520 and the base frame 521 dampens the relative vibration between them using the electromagnetic actuator 502.

In the third stage, subsequent to the second stage, the switch 603 is turned off. In this stage, only the pneumatic actuator performs the relative vibration control (relative position control alone, without damping control). For example, the processing may shift to the third stage if a heavy load is imposed on the electromagnetic actuator in the second stage.

In the fourth stage, power supply to the control unit 605 and drivers 515 and 516 is shut off.

The abnormality determination circuit 604 determines whether the base frame 521 has an absolute vibration abnormality based on a signal from the absolute vibration sensor 503 of the absolute vibration control system for the base frame 521. The fifth embodiment uses the absolute vibration sensor 503. However, if the transfer ratio of vibration from the base frame 521 to the support object 520 is known, it is possible to determine an abnormality of the base frame 521 by estimating the vibration level of the base frame 521 based on a signal from the absolute vibration sensor 504.

As has been described above, according to the fifth embodiment, it is possible to form a seismic vibration avoidance system at a low cost by detecting seismic vibration based on the controlled variable or manipulated variable of skyhook damper control, skyhook spring control, or floor vibration feed-forward control. Using the exposure apparatus according to the fifth embodiment, as the exposure apparatus according to each of the first to third embodiments, makes it possible to form a system with a stronger seismic resistance.

The present invention is applicable, not only to the industrial field of exposure apparatuses, but also, to all vibration isolation devices, which can communicate with the outside world and adopt absolute vibration damping control using, for example, a skyhook damper scheme.

A device (e.g., a semiconductor integrated circuit device or a liquid crystal display device) is manufactured by an exposure step of exposing a substrate coated with a photosensitive agent to light using the exposure apparatus according to the above-described embodiment, a development step of developing the photosensitive agent, and other known steps.

According to the present invention, it is possible to avoid any fault due, for example, to vibration, such as seismic vibration.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A vibration isolation device which dampens vibration of an object, said device comprising:
    a vibration isolation unit which can be activated in a plurality of vibration isolation modes;
    an acquisition unit configured to acquire estimate information associated with vibration of a floor, wherein said acquisition unit receives data associated with an influence degree of seismic vibration and an influence time zone of the seismic vibration from an external device; and
    a control unit configured to select a vibration isolation mode from the plurality of vibration isolation modes, in accordance with the estimate information acquired by said acquisition unit, and to activate said vibration isolation unit in the selected vibration isolation mode, wherein said control unit switches between the vibration isolation modes of said vibration isolation unit in accordance with the influence degree and the influence time zone.

2. The device according to claim 1, wherein the plurality of vibration isolation modes include a first vibration isolation mode for damping an absolute vibration of the object, and a second vibration isolation mode for damping a relative vibration between the floor and the object.

3. The device according to claim 2, wherein said vibration isolation unit includes a first actuator and a second actuators which exhibits a higher power and a lower response speed than a power and response speed of said first actuator,
    in the first vibration isolation mode, said vibration isolation unit dampens an absolute vibration of the object by said first actuator, and
    in the second vibration isolation mode, said vibration isolation unit dampens the absolute vibration by said second actuator.

4. The device according to claim 3, wherein said first actuator includes an electromagnetic actuator, and said second actuator includes a pneumatic sensor.

5. The device according to claim 3, further comprising a thermometer configured to measure a temperature of said first actuator,
    wherein said control unit switches between the first vibration isolation mode and the second vibration isolation mode in accordance with the measurement value obtained by said thermometer.

6. The device according to claim 3, wherein said control unit switches between the first vibration isolation mode and the second vibration isolation mode in accordance with a manipulated variable of said first actuator.

7. An exposure apparatus which exposes a substrate to light, said apparatus comprising:
    a vibration isolation device defined in claim 1; and
    a structure supported by said vibration isolation device.

8. A device manufacturing method comprising the steps of:
    exposing a substrate to light using an exposure apparatus defined in claim 7; and
    developing the exposed substrate.

9. The device according to claim 1, further comprising:
    a sensor configured to detect an absolute vibration of the floor; and
    a transmission unit configured to transmit the signal from said sensor to an external device.

* * * * *